United States Patent
Fujidai et al.

(10) Patent No.: US 9,839,132 B2
(45) Date of Patent: Dec. 5, 2017

(54) COMPONENT-EMBEDDED SUBSTRATE

(75) Inventors: Masanori Fujidai, Nagaokakyo (JP);
Isamu Fujimoto, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 167 days.

(21) Appl. No.: 13/585,920

(22) Filed: Aug. 15, 2012

(65) Prior Publication Data
US 2012/0307466 A1   Dec. 6, 2012

Related U.S. Application Data

(63) Continuation of application No. PCT/JP2011/000885, filed on Feb. 17, 2011.

(30) Foreign Application Priority Data

Feb. 18, 2010  (JP) ................ 2010-033981

(51) Int. Cl.
H05K 1/18 (2006.01)
H01L 23/00 (2006.01)
H05K 3/40 (2006.01)

(52) U.S. Cl.
CPC ............. H05K 1/185 (2013.01); H01L 24/18 (2013.01); H01L 24/19 (2013.01); H01L 24/20 (2013.01);
(Continued)

(58) Field of Classification Search
CPC ..................................... H05K 1/185
(Continued)

(56) References Cited

U.S. PATENT DOCUMENTS

2005/0255303 A1   11/2005   Sawatari et al.
2006/0244131 A1*  11/2006   Kobayashi et al. .......... 257/724
(Continued)

FOREIGN PATENT DOCUMENTS

JP   2001-007531 A   1/2001
JP   2003-309373 A   10/2003
(Continued)

OTHER PUBLICATIONS

Official Communication issued in International Patent Application No. PCT/JP2011/000885, dated May 17, 2011.
Official Communication issued in corresponding Japanese Patent Application No. 2012-500514, dated Sep. 11, 2012.

*Primary Examiner* — Jenny L Wagner
*Assistant Examiner* — Michael E Moats, Jr.
(74) *Attorney, Agent, or Firm* — Keating & Bennett, LLP

(57) ABSTRACT

In a component-embedded substrate, a component and wiring block units are embedded in a component-embedded layer; conductive layers are located on all surfaces of the wiring block units; the component and the wiring block units are arranged such that lower surface side conductive layers of the wiring block units and electrodes of the component contact lower surface side wiring layers; via-hole conductors are located in respective upper positions relative to upper surface side conductive layers of the wiring block units and the electrodes of the component; and upper surface side wiring layers of the component-embedded layer are thus electrically connected to upper surface side conductive layers of the wiring block units, and the electrodes of the component by the via-hole conductors.

14 Claims, 5 Drawing Sheets

(52) U.S. Cl.
CPC .... *H05K 1/186* (2013.01); *H01L 2224/04105* (2013.01); *H01L 2224/2518* (2013.01); *H01L 2924/014* (2013.01); *H01L 2924/01029* (2013.01); *H01L 2924/01033* (2013.01); *H01L 2924/01082* (2013.01); *H01L 2924/07802* (2013.01); *H01L 2924/12042* (2013.01); *H01L 2924/14* (2013.01); *H01L 2924/19041* (2013.01); *H01L 2924/19042* (2013.01); *H01L 2924/19043* (2013.01); *H01L 2924/19105* (2013.01); *H05K 3/4046* (2013.01); *H05K 2201/09509* (2013.01); *H05K 2201/10242* (2013.01); *H05K 2201/10416* (2013.01); *H05K 2201/10636* (2013.01); *H05K 2203/1469* (2013.01); *Y02P 70/611* (2015.11)

(58) Field of Classification Search
USPC .......................... 361/761; 257/333, 353, 724
See application file for complete search history.

(56) References Cited

U.S. PATENT DOCUMENTS

2006/0255440 A1* 11/2006 Miyazaki .......... H01L 23/49822
　　　　　　　　　　　　　　　　　　　　　257/679
2008/0246136 A1* 10/2008 Haba ................... H01L 23/3128
　　　　　　　　　　　　　　　　　　　　　257/686

FOREIGN PATENT DOCUMENTS

| | | |
|---|---|---|
| JP | 2003-347741 A | 12/2003 |
| JP | 2004-128002 A | 4/2004 |
| JP | 2005-311249 A | 11/2005 |
| JP | 2006-310629 A | 11/2006 |
| JP | 4089273 B2 | 5/2008 |
| JP | 2008-288298 A | 11/2008 |
| WO | 2009/072482 A1 | 6/2009 |

* cited by examiner

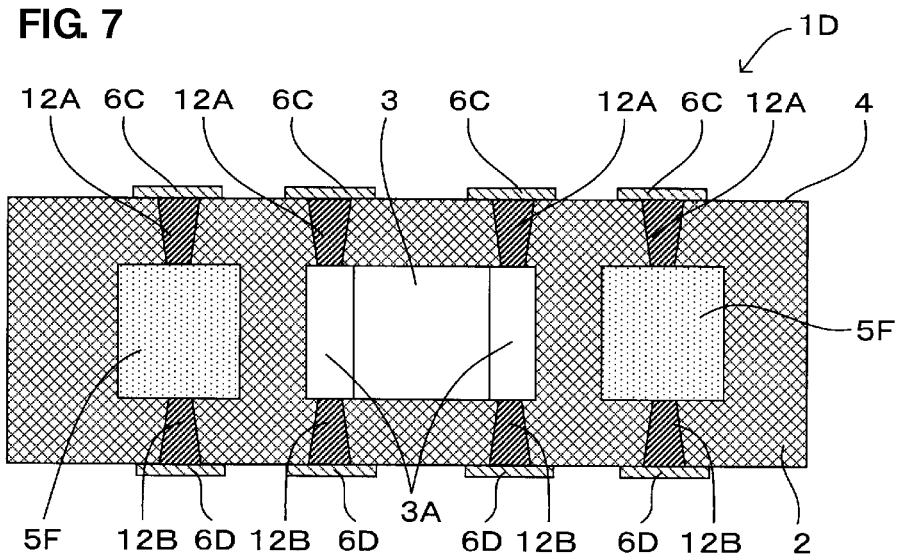
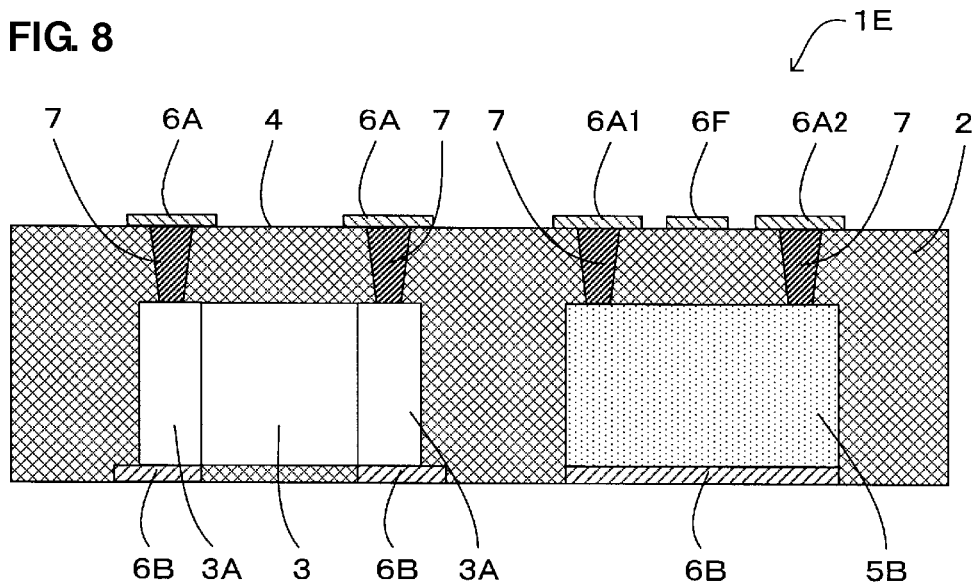

COMPONENT-EMBEDDED SUBSTRATE

BACKGROUND OF THE INVENTION

1. Field of the Invention

The present invention relates to component-embedded substrates incorporating components such as capacitors, chip resistors, chip coils, ICs, and so on, in a resin.

2. Description of the Related Art

Recently, various types of component-embedded substrates have been proposed in which electronic components such as capacitors, chip resistors, chip coils, ICs, and so on, are embedded in a highly-integrated and highly-functional manner as electronic apparatuses become smaller in size and higher in performance.

In such a component-embedded substrate, components are mounted, for example, on a multilayer-structured substrate (multilayer printed-wiring board or the like), a transfer plate on which wiring has been carried out, or the like. The substrate, the transfer plate, or the like with the components mounted thereon is integrated by being embedded in the resin. In order to ensure electrical conductivity between the upper side and the lower side of the substrate and/or between the layers, via holes are formed by laser irradiation so that in-plane conductors disposed on the upper surface and the lower surface of a component-embedded layer of the substrate are electrically conducted. Further via-hole conductors are formed by plating the interior of each of the via holes or filling conductive paste therein. Through these via-hole conductors, a surface layer and a rear layer of the substrate, and the surface layer and the embedded components, are made to be electrically conducted therebetween so as to be electrically connected.

FIG. 9 is a cross-sectional view of a component-embedded substrate formed in a related art, in which a component-embedded substrate 500 embedding a ceramic capacitor 501 therein, which is an electronic component, is illustrated as an example. The configuration of the substrate is as follows.

The ceramic capacitor 501 is adhered on a printed-wiring board 502 with a non-conductive adhesive 503, the printed-wiring board 502 includes an insulating base material 504 and wiring patterns 505A, 505B formed on the upper surface and the lower surface of the insulating base material 504, respectively, and the wiring patterns 505A, 505B are electrically connected with each other via through-holes 506. Each of the through-holes 506 is configured by forming a penetrating hole in the insulating base material 504 and thereafter carrying out plating of a conductive material, such as copper plating on the inner wall of the penetrating hole or filling a conductive material such as solder or conductive paste in the penetrating hole. An insulating resin layer 507 serving as an insulating layer is laminated and molded on the upper surface of the printed-wiring board 502 so as to cover the ceramic capacitor 501.

Wiring layers 508 are formed on the insulating resin layer 507. The wiring layers 508 are electrically connected with wiring patterns 505A on the upper surface side of the printed-wiring board 502 and terminal electrodes 501A of the ceramic capacitor 501 through via-hole conductors 510 and 511 respectively. Each of the via-hole conductors 510, 511 is formed by, for example, carrying out plating on a via hole having been formed by laser processing in the insulating resin layer 507 (for example, see Japanese Patent No. 4089273, especially paragraphs 0041 through 0048, and FIG. 2)).

Meanwhile, in the case of a component-embedded substrate formed in an existing method, such as the component-embedded substrate 500 shown in FIG. 9, via holes are formed first in the insulating resin layer 507 by laser irradiation, and then the via-hole conductors 510 and 511 are formed. However, because of difference in depth of these via holes, laser processing conditions need to be changed for each individual via hole having a different depth. This makes the manufacturing process extremely complex and may lead to a risk of increase in costs due to the increased complexity of the manufacturing process.

In addition, a via hole that penetrates through the insulating resin layer 507 in an up-down direction is required to have a larger diameter and a longer length as the depth of the insulating resin layer 507 increases in dimension. Accordingly, there has been a risk of generating a problem in that the area to be used for mounting and wiring on the upper surface side of the insulating resin layer 57 may be limited.

Furthermore, in the case where wiring is needed to be routed between the layers, a wiring layer for routing the wiring is needed to be formed additionally through another manufacturing method such as a buildup method. Therefore, there has been a risk of generating a problem in that the number of processes to be carried out may be increased.

SUMMARY OF THE INVENTION

Preferred embodiments of the present invention provide a component-embedded substrate in which via holes can be formed without changing laser processing conditions for each via hole, the diameter of a via hole can be kept small while the length (depth) thereof is not required to be longer, and routing of wiring can be easily carried out merely by forming via holes without using another manufacturing method such as a buildup manufacturing method.

A component-embedded substrate according to a preferred embodiment of the present invention includes a component-embedded layer in which at least one component is embedded; at least one wiring layer that is laminated and located on the component-embedded layer; a wiring block unit that is provided in the component-embedded layer and includes at least one conductive surface; and a via-hole conductor that connects the at least one conductive surface of the wiring block unit with the at least one wiring layer.

Preferably, all surfaces of the wiring block unit are covered with metal.

Further, preferably, some continuous surfaces of the wiring block unit, including a connecting surface to be connected with the via-hole conductor and a surface opposed to the connecting surface, are covered with metal.

Furthermore, a connecting surface of the wiring block unit to be connected with the via-hole conductor and an opposed surface that is opposed to the connecting surface preferably are covered with metal, and the connecting surface and the opposed surface are connected with each other through a via-hole conductor located in the interior of the wiring block unit.

Also preferably, a plurality of the wiring layers are located on both principal surface sides of the component-embedded layer, the wiring block unit includes a plurality of the conductive surfaces, the at least one wiring layer including a plurality of wiring layers, the conductive surface located on one principal surface side of the component-embedded layer is connected with the wiring layer located on the one principal surface side of the component-embedded layer through the via-hole conductor, an electrode of the at least one component on the other principal surface side of the component-embedded layer and the conductive surface of the wiring block unit located on the other principal surface side of the component-embedded layer are connected to the wiring layer located on the other principal surface side of the component-embedded layer, and the at least one component is electrically connected with the wiring layer located on the one principal surface side of the component-embedded layer through the wiring layer located on the other principal surface side of the component-embedded layer and the wiring block unit.

It is also preferred that the wiring block unit includes a plurality of the conductive surfaces, the at least one wiring layer including a plurality of wiring layers, the at least one component includes a plurality of components, a plurality of the wiring layers are located on both principal surface sides of the component-embedded layer, an electrode of the component located on one principal surface side of the component-embedded layer and the conductive surface of the wiring block unit located on the one principal surface side of the component-embedded layer are connected with the wiring layer located on the one principal surface side through via-hole conductors, respectively, and an electrode of the component located on the other principal surface side of the component-embedded layer and the conductive surface of the wiring block unit located on the other principal surface side of the component-embedded layer are connected with the wiring layer on the other principal surface side through via-hole conductors, respectively.

According to a preferred embodiment of the present invention, a wiring block unit including at least one conductive surface is provided together with at least one component such as a capacitor, a chip resistor, or other suitable component, in a component embedded layer such that the at least one conductive layer is connected with a wiring layer through a via hole conductor. As a result, it is not necessary to form a via hole penetrating through the component-embedded layer in the up-down direction. If a plurality of via holes are desired, a plurality of via holes having approximately the same length or depth can be provided. Accordingly, unlike in the past, laser processing conditions are not needed to be changed largely for each individual via hole having a different via-hole length (depth) such that all via holes can be formed using the same laser processing condition. This makes it possible to form via holes with ease without causing complexity in the via-hole formation process.

Further, because the formation of a via hole that penetrates through a component-embedded layer in the up-down direction is not needed, it is possible, unlike in the past, to prevent the via-hole diameter of some of via holes from becoming larger and to reduce restriction of usage of the area that can be used for mounting or for wiring on a substrate surface layer such that effective use of the area for mounting or wiring is achieved.

According to a preferred embodiment of the present invention, because all the surfaces of wiring block unit preferably are covered with metal (for example, copper), even in the case where the wiring layers respectively located on the upper and lower surfaces of the component-embedded layer are connected with each other, the connection of the wiring layers on the upper and lower surfaces of the component-embedded layer can be easily carried out through the via-hole conductor and all the conductive surfaces of the wiring block unit without forming a via hole penetrating through the component-embedded layer in the up-down direction.

According to a preferred embodiment of the present invention, because some continuous surfaces of the wiring block unit including a connecting surface to be connected with a via-hole conductor and an opposed surface that is opposed to the connecting surface preferably are covered with metal, even in the case where the wiring layers located on the upper and lower surfaces of the component-embedded layer respectively are connected with each other by routed wiring, that is, in the case of so-called "routing of wiring" being used, a wiring layer for the routing of wiring is not needed to be formed, unlike in the past, through another manufacturing method such as a buildup method. This makes it possible to carry out routing of wiring with ease without causing an increase in the number of processes.

According to a preferred embodiment of the present invention, because the wiring block unit is preferably constructed so that a connecting surface to be connected with a via-hole conductor and an opposed surface that is opposed to the connecting surface are covered with metal, and the connecting surface to be connected with a via-hole conductor and the opposed surface of the wiring block unit are connected with each other through a via-hole conductor, a wiring layer for the routing of wiring is also not needed to be formed using another manufacturing method such as a buildup method in this case, thereby making it possible to carry out routing of wiring with ease without causing an increase in the number of processes.

According to a preferred embodiment of the present invention, because an electrode of the component on the other principal surface side of the component-embedded layer and a conductive surface of the wiring block unit on the other principal surface side of the component-embedded layer are connected to the wiring layer located on the other principal surface side of the component-embedded layer, and the component is electrically connected with the wiring layer on the one principal surface side of the component-embedded layer through the wiring layer on the other principal surface side of the component-embedded layer and the wiring block unit, in the case where, for example, laser irradiation onto the component for forming a via hole is not preferable due to the lack of a laser-resistant property of the component, it is possible to electrically connect the component to the wiring layer on the one principal surface side of the component-embedded layer without forming a via hole corresponding to the component and to prevent breakage of the component by laser irradiation in advance.

According to a preferred embodiment of the present invention, because electrodes of the component on both the principal surface sides of the component-embedded layer and conductive surfaces of the wiring block unit on both the principal surface sides of the component-embedded layer are connected with the wiring layers on both the principal surface sides of the component-embedded layer through via-hole conductors respectively, in the case where signal wiring is carried out on both the principal surfaces of the component-embedded layer in different wiring patterns from each other, or the like, it is possible to carry out wiring between the two principal surfaces with ease.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 is a cross-sectional view of a component-embedded substrate according to a fifth preferred embodiment of the present invention.

FIG. 8 is a cross-sectional view of another variation of a preferred embodiment of the present invention.

DETAILED DESCRIPTION OF THE PREFERRED EMBODIMENTS

Preferred embodiments of the present invention will be described with reference to FIGS. 1 through 8.
First Preferred Embodiment A first preferred embodiment of the present invention will be described first with reference to FIGS. 1 and 2.

Figure 1:
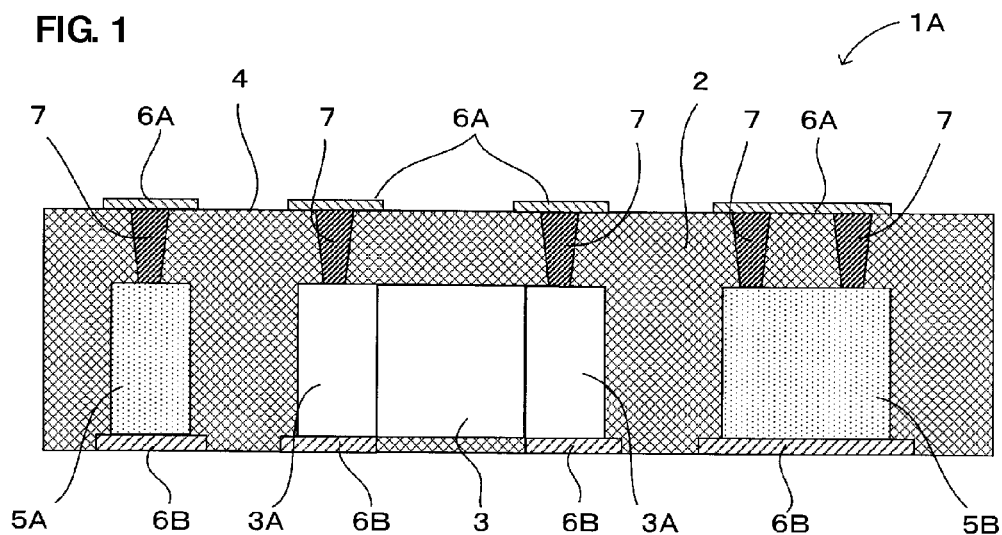
FIG. 1 is a cross-sectional view of a component-embedded substrate according to a first preferred embodiment of the present invention.

FIG. 1 illustrates a component-embedded substrate 1A of the first preferred embodiment. The component-embedded substrate 1A includes a component-embedded layer 4 embedding at least one chip component 3, which is an electronic component such as a capacitor, a chip resistor, an IC or other suitable component, in a resin layer 2 preferably made of a thermosetting resin such as epoxy resin, phenol resin, or other suitable material, for example. A plurality of wiring block units 5A, 5B each having a different size and a chip component shape, similar to that of the component 3, such as a rectangular parallelpiped or a cube, for example, are embedded in the component-embedded layer 4. Conductive layers 51A and 51B, being plated with copper, for example, are preferably formed on all surfaces (six surfaces), of each of the wiring block units 5A and 5B, respectively. Although the wiring block units 5A and 5B may be formed in a chip component shape such as a rectangular parallelpiped or a cube, a cylinder shape, a polygonal column shape, or the like can be favorably used also, for example. That is, the wiring block units 5A and 5B can have any shape as long as they can be embedded in the component-embedded layer 4.

Wiring layers 6A are laminated and located on the upper surface that is one principal surface of the component-embedded layer 4, and wiring layers 6B of an in-plane wiring structure are located on the lower surface that is one principal surface of the component-embedded layer 4. The wiring block units 5A, 5B and electrodes 3A of the component 3 are disposed at predetermined positions in the component-embedded layer 4 respectively, so that the conductive layers 51A, 51B on the lower surface side of the wiring block units 5A, 5B (see FIG. 2) and the electrodes 3A formed with copper, for example, of the component 3 make contact with the wiring layers 6B on the lower surface side.

Further, the wiring layers 6A on the upper surface side of the component-embedded layer 4 and the conductive layers 51A, 51B on the upper surface side of the wiring block units 5A, 5B (see FIG. 2) as well as the electrodes 3A of the component 3 are electrically connected by via-hole conductors 7 provided in the component-embedded layer 4.

A laser beam is irradiated onto the upper positions relative to the conductive layers 51A, 51B on the upper surface side of the wiring block units 5A, 5B and the electrodes 3A of the component 3 according to predetermined laser processing conditions so as to form via holes, and the via-hole conductors 7 are formed by filling conductive paste using a material such as copper, or by via-filling using plating technology, the laser-formed via holes, or other suitable process. Thereafter, each of the wiring layers 6A preferably is formed at a position on the upper surface of the component-embedded layer 4 where the wiring layer makes contact with each of the via-hole conductors 7.

Here, since the dimension of the wiring block units 5A, 5B and the dimension of the component 3 are approximately the same in the height direction (up-down direction), the via holes formed in the upper positions relative to the conductive layers 51A, 51B on the upper surface side of the wiring block units 5A, 5B and the electrodes 3A of the component 3 have approximately the same length (depth). As a result, unlike in the past, all via holes can be formed under the same laser processing conditions and the diameters of all via holes can be made approximately the same without causing an increase in the via-hole diameter. The increase in the via-hole diameter occurs when one or more of the via holes is produced so as to have a via-hole length that is longer than that of the other via holes.

As shown in FIG. 1, the two via-hole conductors 7 are formed with respect to the wiring block unit 5B, which is larger than the other unit. Note that this is an example in which, in order to reduce wiring impedance between the upper side and the lower side of the component-embedded substrate 1A, to ensure current capacity and so on, a necessary number of the via-hole conductors 7 between the upper surface (surface layer) of the component-embedded substrate 1A and the wiring block unit 5B is determined and set to form the via-hole conductors 7. It is also to be noted that the number of via-hole conductors formed with respect to the wiring block unit 5B is not limited to two, and the number may be one, or three or more. In addition, it may be allowable to form two or more via-hole conductors 7 with respect to the wiring block unit 5A in FIG. 1; in this case, a larger wiring block unit than the one shown in FIG. 1 will preferably be used as the wiring block unit 5A considering that a plurality of via-hole processings are carried out.

Therefore, according to the above-described first preferred embodiment, because the configuration thereof is such that the conductive layers 51A, 51B of the wiring block units 5A, 5B as well as the electrodes 3A of the component 3 are connected to the wiring layers 6A through the via-hole conductors 7, in the case where the wiring layer 6A on the upper side and the wiring layer 6B on the lower side are connected with each other, it is only necessary to form via holes having approximately the same via-hole length (depth) unlike in the past, and the formation of via holes penetrating through the component-embedded layer 4 in the up-down direction is not needed. Accordingly, it is not required to significantly change the laser processing conditions for each individual via hole having a different via-hole length (depth) and all the via holes can be formed under the same laser processing conditions, thereby making it possible to form the via-hole conductors 7 without troublesome complications being generated during the via-hole formation process.

In addition, it is not necessary to form a via-hole that penetrates through the component-embedded layer 4 in the up-down direction. As a result, the via-hole conductors 7 can be formed by forming approximately the same via holes. As a result, the via-hole length (depth) is allowed to be shorter, and it is possible, unlike in the past, to prevent a via-hole diameter of a via hole from becoming larger and also to prevent from being restricted of usage of the area that can be used for mounting or wiring on the upper surface (surface layer) of the component-embedded substrate 1A. Consequently, the above-mentioned area can be used effectively for mounting or wiring.

Further, by forming two or more via-hole conductors with respect to the wiring block unit 5B (5A), it is possible to reduce wiring impedance between the upper side and the lower side of the component-embedded substrate 1A, ensure current capacity with ease. In this case, by variably setting the number of the via-hole conductors 7 to be formed, it is possible to easily correspond to a necessary amount of reduction in wiring impedance, a necessary amount of current capacity.

The conductive layers 51A and 51B on all surfaces of the wiring block units 5A and 5B can be easily formed by copper plating, for example, and the conductive layers 51A and 51B being plated with copper are much suited for the case in which via-hole processing is carried out with laser irradiation. It is to be noted that the conductive layers 51A, 51B are not specifically limited to being plated with copper, and may be formed by any method as long as the via-hole processing can be carried out with ease. In addition, the wiring block units 5A, 5B themselves may be formed with a conductive material such as metal.

Second Preferred Embodiment

Next, a second preferred embodiment of the present invention will be described with reference to FIGS. 3A and 3B.

Figure 2:
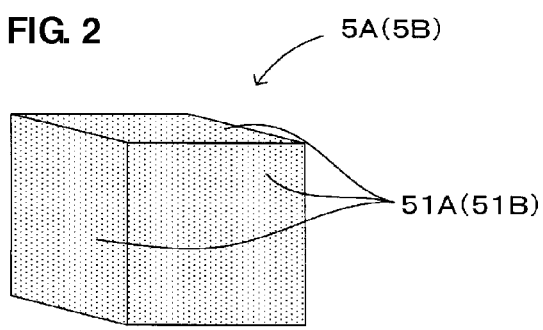
FIG. 2 is a perspective view of a wiring block unit in the component-embedded substrate of FIG. 1.
Figure 3A:
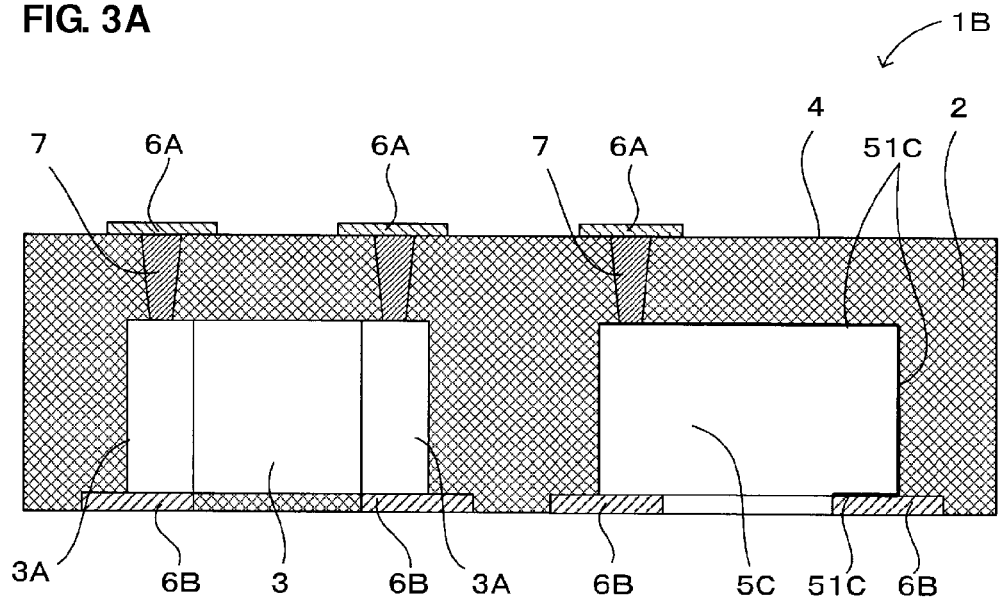
FIG. 3A is a cross-sectional view of a component-embedded substrate and FIG. 3B is a perspective view of a wiring block unit which is a constituent element of the component-embedded substrate according to a second preferred embodiment of the present invention.
Figure 3B:
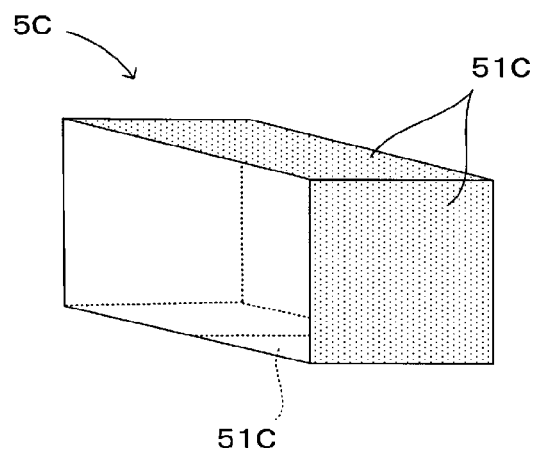

FIGS. 3A and 3B illustrate a component-embedded substrate 1B according to the second preferred embodiment, in which the same reference signs as those in FIGS. 1 and 2 denote the same or equivalent elements. Hereinafter, different points from the first preferred embodiment will be primarily described.

In the second preferred embodiment, what is different from the first preferred embodiment (FIGS. 1 and 2) is that so-called routing of wiring is carried out through a wiring block unit and a via-hole conductor. In other words, as shown in FIGS. 3A and 3B, the different point from the first preferred embodiment is as follows. A wiring block unit 5C that preferably has a chip component shape and includes conductive layers 51C formed by copper plating or other suitable process, for example, on the upper surface of resin base material, one side surface such as a right side surface extending continuously from the upper surface, and a portion of the lower surface extending continuously from the one side surface, is embedded together with the component 3 in the component-embedded layer 4; the via-hole conductor 7 is located in the upper position relative to the conductive layer 51C on the upper surface side of the wiring block unit 5C; and a conductive path is arranged to extend from the wiring layer 6A on the upper surface side down to the wiring layer 6B on the lower surface side of the component-embedded layer 4 through the via-hole conductor 7, the conductive layer 51C on the upper surface side of the wiring block unit 5C and the conductive layers 51C on two surfaces extending continuously from the conductive layer 51C on the upper surface side of the wiring block unit 5C.

In this case, selecting an appropriate size of the wiring block unit 5C based on a distance of routing of wiring and setting the length of wiring to be located on the selected unit by the conductive layers 51C, make it quite easy to set a distance of routing of wiring as needed.

Therefore, according to the second preferred embodiment, in the case where routing of wiring is needed to be carried out in the component-embedded layer 4 depending on the positional relationship between the electrodes 3A of the component 3 embedded in the component-embedded layer 4 and the wiring layers 6A, 6B on the upper and lower sides, the routing of wiring can be easily carried out by forming a conductive path from the conductive layer 6A on the upper side to the conductive layer 6B on the lower side though the via-hole conductor 7 and the conductive layers 51C extending continuously from the conductive layer 51C on the upper surface side of the wiring block unit 5C across the three surfaces. Accordingly, unlike in the past, it is not necessary to form a wiring layer for the routing of wiring by using another manufacturing method such as a buildup method, thereby making it possible to prevent an increase in the number of processes.

Third Preferred Embodiment

A third preferred embodiment of the present invention will be described with reference to FIGS. 4A and 4B.

Figure 4A:
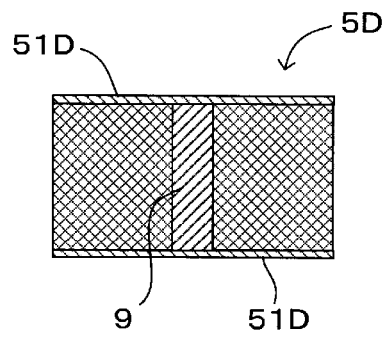
FIG. 4A is a cross-sectional view of a wiring block unit in a component-embedded substrate and FIG. 4B is a perspective view thereof according to a third preferred embodiment of the present invention.
Figure 4B:
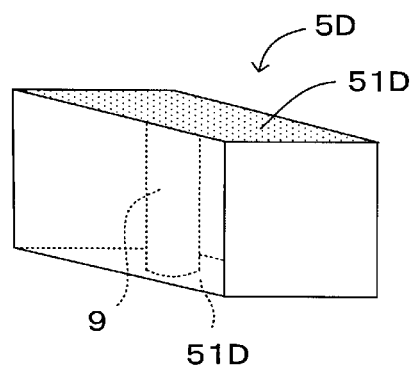

FIGS. 4A and 4B illustrate a wiring block unit 5D embedded in a component-embedded substrate according to the third preferred embodiment, and a preferable example of routing of wiring is described with the wiring block unit 5D as with the wiring block unit 5C of the above-described second preferred embodiment (FIGS. 3A and 3B). That is, conductive layers 51D are arranged on the upper side surface and the lower side surface of the wiring block unit 5D so as to oppose each other, and these conductive layers 51D arranged on the surfaces opposing each other are not electrically conducted to each other by a conductive layer on one side surface (for example, right side surface) as in the wiring block unit 5C, but are connected by a via-hole conductor 9 located at the approximately central position of the wiring block unit 5D penetrating therethrough in the up-down direction.

With this unique arrangement, the routing of wiring can be easily carried out as in the above-described second preferred embodiment.

Figure 5A:
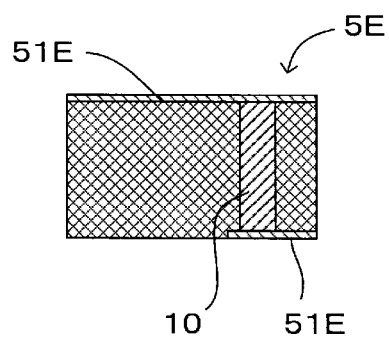
FIG. 5A is a cross-sectional view of a variation and FIG. 5B is a perspective view thereof on the third preferred embodiment.
Figure 5B:
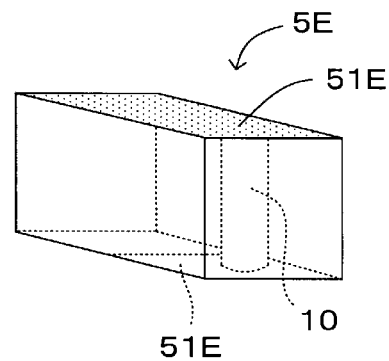

As a variation on the third preferred embodiment, as shown in FIGS. 5A and 5B, a conductive layer 51E is arranged preferably on the entire upper surface of a wiring block unit 5E and another conductive layer 51E is arranged on a portion of the lower surface thereof, and the conductive layers 51E on the upper surface and the lower surface may be connected with each other by a via-hole conductor 10 located at a position that is shifted from the center of the wiring block unit 5E toward one side thereof penetrating therethrough in the up-down direction. With this, the same effect can be obtained as in the case illustrated in FIGS. 4A and 4B.

Fourth Preferred Embodiment

A fourth preferred embodiment of the present invention will be described with reference to FIG. 6.

Figure 6:
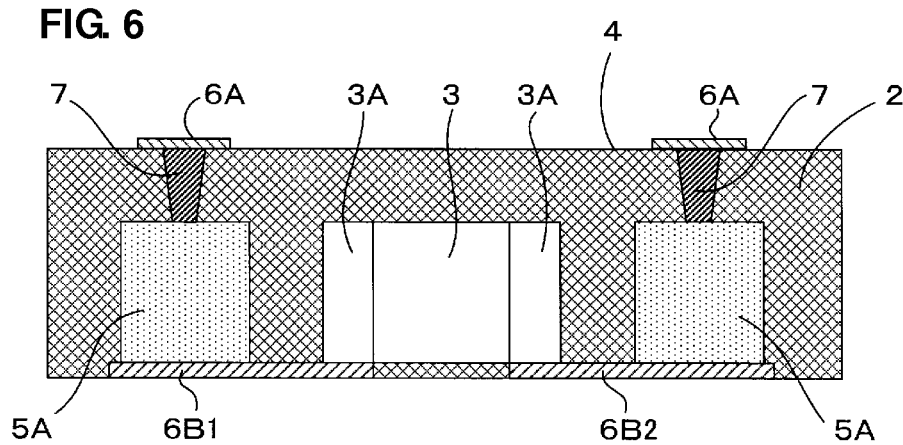
FIG. 6 is a cross-sectional view of a component-embedded substrate according to a fourth preferred embodiment of the present invention.
Figure 9:
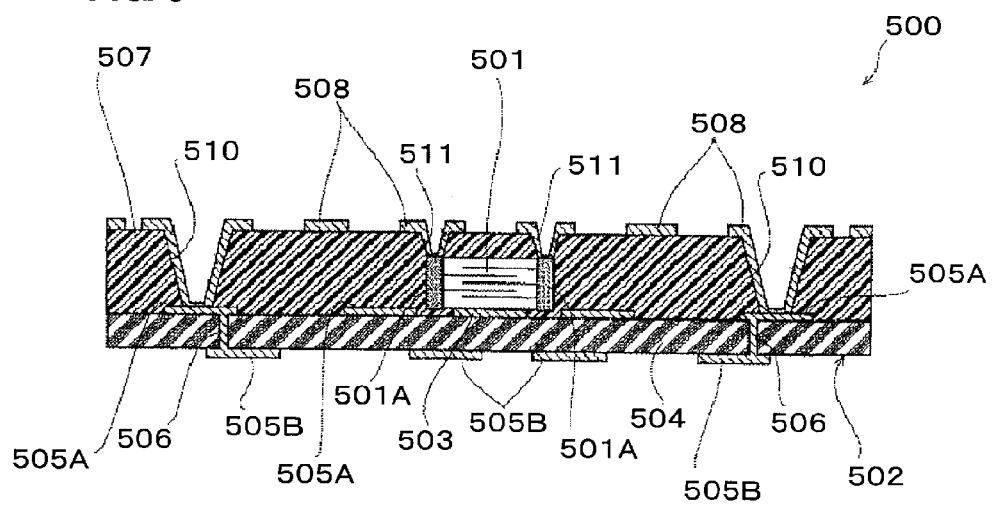
FIG. 9 is a cross-sectional view of a component-embedded substrate formed in an existing method.

FIG. 6 illustrates a component-embedded substrate 1C according to the fourth preferred embodiment, in which the same reference signs as those in FIGS. 1 and 2 denote the same or equivalent elements. Hereinafter, different points from the first preferred embodiment will be primarily described.

In the fourth preferred embodiment illustrated in FIG. 6, what is different from the first preferred embodiment (FIGS. 1 and 2) is as follows. That is, in the case where a via-hole conductor is preferred to be provided with respect to the component 3, if there is a restriction such that it is not preferable to directly form a via-hole with respect to the component 3 due to the component 3 itself lacking a laser-resistant property or the like, the electrodes 3A of the component 3 are ensured to be electrically conductive through the conductive layers 51A of the two wiring block units 5A, the wiring layers 6A on the upper side of the component-embedded layer 4, and the wiring layers 6B1, 6B2 on the lower side thereof.

More specifically, as shown in FIG. 6, in the case where a wiring layer on the lower surface side is arranged so as to be separated into the two wiring layers 6B1 and 6B2, the component 3 is disposed in the component-embedded layer 4 so that the electrodes 3A at both ends of the component 3 make contact with the wiring layers 6B1 and 6B2 respectively, and the two wiring block units 5A are disposed in the component-embedded layer 4 so that the conductive layer 51A on the lower surface of the one wiring block unit 5A makes contact with the one wiring layer 6B1 while the conductive layer 51A on the lower surface of the other wiring block unit 5A makes contact with the other wiring layer 6B2.

Therefore, a laser beam is irradiated onto the respective upper positions relative to the conductive layers 51A on the upper surfaces of the two wiring block units 5A under a predetermined laser processing condition so as to form via holes, and the via-hole conductors 7 are formed by filling conductive paste using such as copper or carrying out via-filling by plating technology in the laser-formed via holes. After this forming, each of the wiring layers 6A is formed preferably at a position on the upper surface of the component-embedded layer 4 where the wiring layer makes contact with each of the via-hole conductors 7.

Through this unique process, a conductive path configured of the wiring layer 6A of the component-embedded layer 4, the conductive layers 51A of the one wiring block unit 5A, the wiring layer 6B1 of the component-embedded layer 4, the component 3, the wiring layer 6B2 of the component-embedded layer 4, the conductive layers 51A of the other wiring block unit 5A, and the wiring layer 6A of the component-embedded layer 4 is formed so as to ensure that the component 3 is electrically conductive.

Therefore, according to the fourth preferred embodiment, even if it is not preferable to directly form a via-hole with respect to the component 3 due to the component 3 itself lacking a laser-resistant property or the like, the electrodes 3A of the component 3 can be ensured to be electrically conductive through the conductive layers 51A of the two wiring block units 5A, the wiring layers 6A on the upper side of the component-embedded layer 4, the wiring layers 6B1, 6B2 on the lower side of the component-embedded layer 4, and the via-hole conductors 7, thereby making it possible to widen the degrees of freedom in circuit design.

Fifth Preferred Embodiment

A fifth preferred embodiment of the present invention corresponding to claim 6 will be described with reference to FIG. 7.

FIG. 7 illustrates a component-embedded substrate 1D according to the fifth preferred embodiment, in which the same reference signs as those in FIGS. 1 and 2 denote the same or equivalent elements. Hereinafter, different points from the first preferred embodiment will be primarily described.

In the fifth preferred embodiment illustrated in FIG. 7, what is different from the first preferred embodiment (FIGS. 1 and 2) is as follows. That is, the chip component 3, which is an electronic component such as a capacitor, a chip resistor, or other suitable component, is embedded at an approximately central position of the component-embedded layer in the height direction (up-down direction) thereof; two wiring block units 5F, each of which includes conductive layers preferably located on all surfaces (six surfaces) of resin base material by copper plating and each of which has a chip component shape such as a rectangular parallelpiped, a cube or the like similar to that of the component 3, are also embedded at approximately central positions of the component-embedded layer 4 in the height direction thereof as in the case of the component 3; a laser beam is irradiated onto the upper positions relative to the conductive layers on the upper surface side of the two wiring block units 5F and the electrodes 3A of the component 3 under a predetermined laser processing condition so as to form via holes; the via-hole conductors 12A are formed by filling conductive paste using a material such as copper or carrying out via-filling by plating technology in the laser-formed via holes, or other suitable process, for example; a laser beam is irradiated onto the lower positions relative to the conductive layers on the lower surface side of the two wiring block units 5F and the electrodes 3A of the component 3 under the same laser processing condition as that of the time of forming the upper side via holes so as to form via holes; the via-hole conductors 12B are formed by filling conductive paste using such as copper or carrying out via-filling by plating technology in the formed via holes, or other suitable process; and then, conductive layers 6C and 6D are laminated and formed at positions in the upper surface and the lower surface of the component-embedded layer 4 where those wiring layers make contact with the via-hole conductors 12A and 12B, respectively.

In this case, the wiring layers 6C and 6D on the upper surface and the lower surface of the component-embedded layer 4 are electrically connected with each other through the upper side via-hole conductors 12A, the conductive layers of the wiring block units 5F, and the lower side via-hole conductors 12B; and the wiring layers 6C, 6D are connected with each other through the upper side via-hole conductors 12A, the electrodes 3A of the component, and the lower side via-hole conductors 12B. This makes it possible to provide preferred signal wiring in addition to the wiring of the component 3.

Therefore, according to the fifth preferred embodiment, because the component 3 and the wiring block units 5F are connected with the wiring layers 6C and 6D located on the upper side and the lower side of the component-embedded layer 4 respectively by the upper side via-hole conductors 12A and the lower side via-hole conductors 12B, carrying out wiring on the upper surface and the lower surface of the component-embedded layer 4 is further preferred.

Other Preferred Embodiments

FIG. 8 illustrates another example of a preferred embodiment of the present invention. Particularly, in a component-embedded substrate 1E, which is almost the same as the component-embedded substrate 1A according to the first preferred embodiment, in the case where a special wiring pattern is located on the upper surface (surface layer) of the component-embedded layer 4 such that a wiring layer in the upper position relative to the wiring block unit 5B is separated into two wiring layers 6A1, 6A2, and another wiring layer 6F that is not allowed to make contact with either the wiring layer 6A1 or the wiring layer 6A2 is present between those two wiring layers, the separated wiring layers 6A1 and 6A2 are connected with each other through the two via-hole conductors 7 corresponding to the wiring block unit 5B and the conductive layer 51B (see FIG. 2) on the upper surface of the wiring block unit 5B. With this, even if, between the wiring layers 6A1 and 6A2 being separated due to wiring pattern restriction or the like, another wiring layer F being not allowed to make contact with any of those two wiring layers is present, the separated wiring layers 6A1 and 6A2 can be easily connected with each other.

It is to be noted that the present invention is not limited to the preferred embodiments described above, and various kinds of variations, modifications and combinations can be made other than the above-described preferred embodiments and without departing from the spirit and scope of the present invention. For example, the resin layer 2 of the component-embedded layer 4 may be formed of a light curing resin or other suitable material.

Preferred embodiments of the present invention can be widely applied in manufacturing techniques of component-embedded substrates including component-embedded layers therein.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A component-embedded substrate comprising:
   a component-embedded layer in which at least one component is embedded;
   a plurality of wiring layers that are laminated and located on both principal surface sides of the component-embedded layer;
   a wiring block unit that is provided in the component-embedded layer and includes at least one conductive surface; and
   a predetermined number of at least two via-hole conductors that connect one conductive surface of the at least one conductive surface of the wiring block unit with at least one of the plurality of wiring layers; wherein
   the wiring block unit conductively connects a wiring layer of the plurality of wiring layers that is located on one principal surface side of the component-embedded layer with a wiring layer of the plurality of wiring layers that is located on the other principal surface side of the component-embedded layer; and
   the wiring block unit is directly connected to at least one of the at least two via-hole conductors.

2. The component-embedded substrate according to claim 1, wherein all surfaces of the wiring block unit are covered with metal.

3. The component-embedded substrate according to claim 1, wherein some continuous surfaces of the wiring block unit including a connecting surface to be connected with the at least two via-hole conductors and a surface opposed to the connecting surface, are covered with metal.

4. The component-embedded substrate according to claim 1, wherein a connecting surface to be connected with the at least two via-hole conductors and an opposed surface that is opposed to the connecting surface of the wiring block unit are covered with metal, and the connecting surface and the opposed surface are connected with each other through another via-hole conductor located in an interior of the wiring block unit.

5. The component-embedded substrate according to claim 1, wherein
   the wiring block unit includes a plurality of the conductive surfaces;
   a conductive surface of the plurality of conductive surfaces located on the one principal surface side of the component-embedded layer is connected with the wiring layer located on the one principal surface side of the component-embedded layer through the at least two via-hole conductors;
   an electrode of the at least one component located on the other principal surface side of the component-embedded layer and a conductive surface of the plurality of conductive surfaces of the wiring block unit located on the other principal surface side of the component-embedded layer are connected to the wiring layer located on the other principal surface side of the component-embedded layer; and
   the at least one component is electrically connected with the wiring layer located on the one principal surface side of the component-embedded layer through the wiring layer located on the other principal surface side of the component-embedded layer and the wiring block unit.

6. The component-embedded substrate according to claim 1, wherein
   the wiring block unit includes a plurality of the conductive surfaces;
   the at least one component includes a plurality of components;
   an electrode of the plurality of components located on the one principal surface side of the component-embedded layer and a conductive surface of the plurality of conductive surfaces of the wiring block unit located on the one principal surface side of the component-embedded layer are connected with the wiring layer located on the one principal surface side through the at least two via-hole conductors, respectively; and
   an electrode of the plurality of components located on the other principal surface side of the component-embedded layer and a conductive surface of the plurality of conductive surfaces of the wiring block unit located on the other principal surface side of the component-embedded layer are connected with the wiring layer on the other principal surface side through via-hole conductors, respectively.

7. A component-embedded substrate comprising:
   a component-embedded layer in which at least one chip component is embedded;
   at least one wiring layer that is laminated and located on the component-embedded layer;
   a wiring block unit that is provided in the component-embedded layer and includes at least one conductive surface; and
   a via-hole conductor that connects the at least one conductive surface of the wiring block unit with the at least one wiring layer; wherein
   the wiring block unit and each of the at least one chip component have a same or substantially a same height in an up-down direction of the component-embedded substrate.

8. The component-embedded substrate according to claim 7, further comprising:
   a second via-hole conductor that connects the at least one conductive surface of the wiring block unit with the at least one wiring layer; wherein the via-hole conductor and the second via-hole conductor have a same or substantially a same length in an up-down direction of the component-embedded substrate.

9. The component-embedded substrate according to claim 7, further comprising:
   at least one second via-hole conductor that respectively connects the at least one chip component with the at least one wiring layer; wherein
   the via-hole conductor and the at least one second via-hole conductor have a same or substantially a same length in an up-down direction of the component-embedded substrate.

10. The component-embedded substrate according to claim 7, wherein all surfaces of the wiring block unit are covered with metal.

11. The component-embedded substrate according to claim 7, wherein some continuous surfaces of the wiring block unit including a connecting surface to be connected with the via-hole conductor and a surface opposed to the connecting surface, are covered with metal.

12. The component-embedded substrate according to claim 7, wherein a connecting surface to be connected with the via-hole conductor and an opposed surface that is opposed to the connecting surface of the wiring block unit are covered with metal, and the connecting surface and the opposed surface are connected with each other through another via-hole conductor located in an interior of the wiring block unit.

13. The component-embedded substrate according to claim 7, wherein
   a plurality of the wiring layers are located on both principal surface sides of the component-embedded layer;
   the wiring block unit includes a plurality of the conductive surfaces;
   the at least one wiring layer including a plurality of wiring layers;
   the conductive surface located on one principal surface side of the component-embedded layer is connected with the wiring layer located on the one principal surface side of the component-embedded layer through the via-hole conductor;
   an electrode of the at least one chip component on the other principal surface side of the component-embedded layer and the conductive surface of the wiring block unit located on the other principal surface side of the component-embedded layer are connected to the wiring layer located on the other principal surface side of the component-embedded layer; and
   the at least one chip component is electrically connected with the wiring layer located on the one principal surface side of the component-embedded layer through the wiring layer located on the other principal surface side of the component-embedded layer and the wiring block unit.

14. The component-embedded substrate according to claim 7, wherein
   the wiring block unit includes a plurality of the conductive surfaces;
   the at least one wiring layer including a plurality of wiring layers;
   the at least one chip component includes a plurality of chip components;
   a plurality of the wiring layers are located on both principal surface sides of the component-embedded layer;
   an electrode of the component located on one principal surface side of the component-embedded layer and the conductive surface of the wiring block unit located on the one principal surface side of the component-embedded layer are connected with the wiring layer located on the one principal surface side through via-hole conductors, respectively; and
   an electrode of the component located on the other principal surface side of the component-embedded layer and the conductive surface of the wiring block unit located on the other principal surface side of the component-embedded layer are connected with the wiring layer on the other principal surface side through via-hole conductors, respectively.

* * * * *